US 6,426,914 B1

(12) United States Patent
Dennard et al.

(10) Patent No.: US 6,426,914 B1
(45) Date of Patent: Jul. 30, 2002

(54) FLOATING WORDLINE USING A DYNAMIC ROW DECODER AND BITLINE VDD PRECHARGE

(75) Inventors: Robert H. Dennard, New Rochelle; Louis L. Hsu, Fishkill; Toshiaki K. Kirihata, Poughkeepsie, all of NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/839,105

(22) Filed: Apr. 20, 2001

(51) Int. Cl.[7] .................................................. G11C 8/00
(52) U.S. Cl. ........................ 365/230.06; 365/189.06; 365/203
(58) Field of Search ........................... 365/230.06, 203, 365/189.06

(56) References Cited

U.S. PATENT DOCUMENTS

| | | | | |
|---|---|---|---|---|
| 5,602,784 A | * | 2/1997 | Kojima et al. | 365/189.09 |
| RE35,750 E | * | 3/1998 | Casper et al. | 365/203 |
| 5,901,096 A | * | 5/1999 | Inokuchi et al. | 365/201 |
| 6,044,035 A | * | 3/2000 | Kohno | 365/230.06 |
| 6,157,216 A | * | 12/2000 | Laatimore et al. | 326/83 |

* cited by examiner

*Primary Examiner*—Son T. Dinh
(74) *Attorney, Agent, or Firm*—Scully, Scott, Murphy & Presser; Robert M. Trepp. Esq.

(57) ABSTRACT

A short cycle DRAM use a floating wordline, dynamic row decoder and bitline VDD precharge, which improves the array efficiency of the short cycle DRAM (3–6 ns) without compromising its performance. A small size wordline driver circuit is provided to reduce the row size of the short cycle DRAM without compromising row access timing. A dynamic decoding operation is implemented which intentionally allows some of the deselected wordlines to float during row access. A Vdd bitline precharge/sensing technique avoids a detrimental (or positive) coupling effect to the floating wordlines during row accessing. A Vdd data-line (or DQ) precharge for a read operation, and control of incoming data timing avoids a detrimental (or positive) coupling effect for a write operation.

20 Claims, 6 Drawing Sheets

FIG. 4B

FLOATING WORDLINE USING A DYNAMIC ROW DECODER AND BITLINE VDD PRECHARGE

BACKGROUND OF THE INVENTION

1. Field of the Invention

The present invention relates generally to a short cycle DRAM using a floating wordline, a dynamic row decoder and bitline VDD precharge, and more particularly pertains to a short cycle DRAM using a floating wordline, a dynamic row decoder and bitline VDD precharge, primarily to reduce the DRAM size.

2. Discussion of the Prior Art

In the historical development of DRAMs, the speed of a DRAM has not been as important as its density. In a processor system, a DRAM is used as the main memory for storing large amounts of back-up data. While SRAMs, due to their high-performance nature, are used mostly for L1 or L2 cache for storing data to be used immediately by the processors. However, as the technology and circuit techniques have improved, the performance of DRAMs now approaches that of SRAMs. On the other hand, the density of SRAMs still cannot compete with that of DRAMs. As a result, there have been more recent proposals for high performance DRAM designs aimed at markets for SRAM replacement, for example, one-transistor SRAM, cache DRAM and short cycle DRAM, DRAM cores with RAM-BUS interface protocol, etc.

A short cycle DRAM proposed by Kirihata, et al. (IBM docket FIS920000411) was claimed to be able to achieve a cycle time of 3.3 ns using today 0.17 um technology. Key elements to accomplish such high performance include, (1) small array size and thus less loading on wordlines, bitlines and datalines, (2) destructive read/write, therefore, no write-back period is required within each cycle, (3) A small dual-port SRAM cache is used to schedule pipelined caching activities, and (4) very wide data I/O for high data rate embedded applications. This short cycle DRAM does not support page mode operation.

For designing a short cycle DRAM, one critical concern is how to keep the array efficiency (i.e. ratio of array area over total chip area) high, so that the density is still much higher than that of a SRAM. Due to a small array architecture, the array efficiency of a short cycle DRAM is much lower than that of a conventional DRAM. For example, each wordline of a short cycle DRAM drives only 128 pairs of bitlines.

Figure 1A:
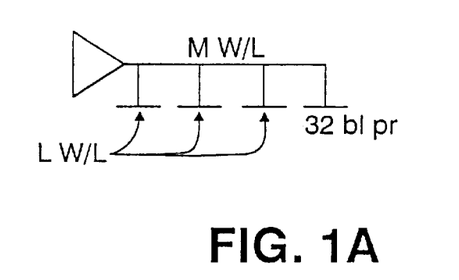
FIG. 1 is a comparison of wordline driver and wordline length for the present invention as shown in FIG. 1A and the prior art as shown in FIG. 1B.
Figure 1B:
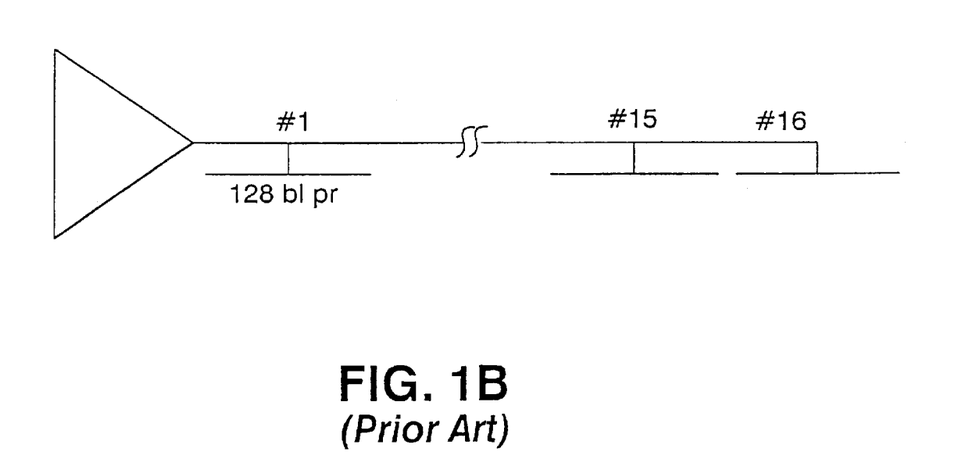

FIG. 1 is a comparison of wordline driver and wordline length for the present invention and the prior art. FIG. 1A illustrates the present invention wherein a master wordline MW/L drives 4 sets of local wordlines LW/Ls, each of which has 32 bitline pairs, for a total of 128 pairs of bitlines. For a conventional high-density DRAM, as shown in FIG. 1B, each wordline may drive up to 2048 pairs of bitlines, or 16 times more. Therefore, it is important to significantly reduce the size of support devices, such as wordline drivers, sense amplifiers, etc., in order for a short-cycle DRAM to be attractive in the high-performance RAM market.

Figure 2A:
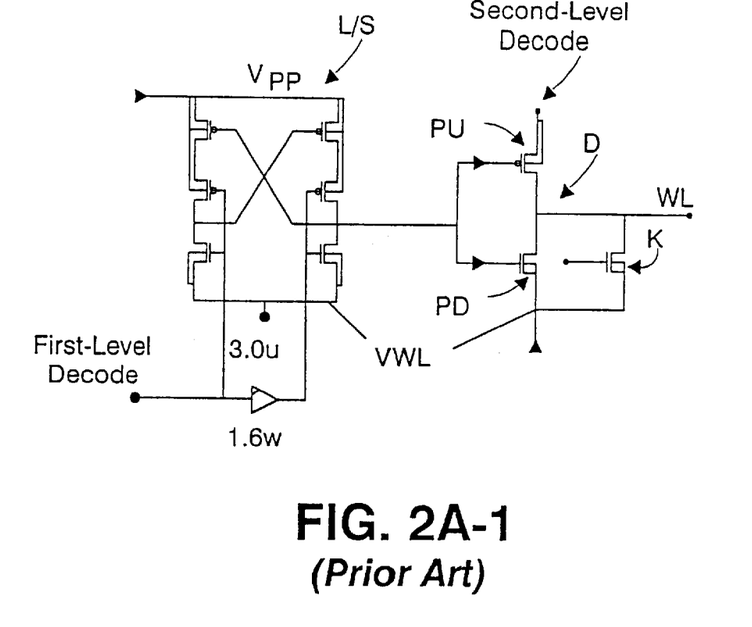
Figure 2A:
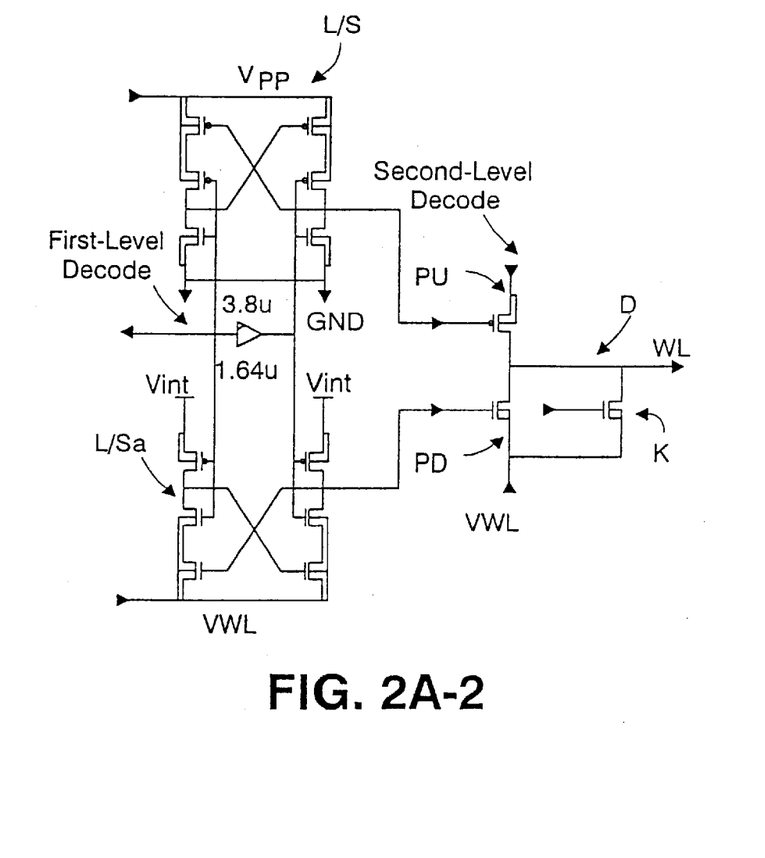

FIG. 2A-1 illustrates a typical prior art wordline driver of a conventional DRAM which comprises a level shifter L/S and a driver D. The level shifter converts the input address voltage from ground/Vint, to Vwl/Vpp (or negative wordline voltage−0.5V/boost wordline voltage, e.g. 2.0V). However, this approach suffers a high dielectric stress problem. For example, the worst switching stress on the pMOS pull-up device PU is in the range of Vpp to a negative level.

To reduce such a stress, in the prior art circuit of FIG. 2A-2 two level shifters L/S, L/Sa are used. In the circuit of FIG. 2A-1 and other circuits herein, as is conventional in the art, pMOS devices are illustrated with a small circle at the gate thereof and nMOS devices are illustrated without such a small circle. The switching stress is now reduced to Vpp-ground on the pMOS pull-up device PU of the wordline driver. Similarly, the other level shifter L/Sa reduces the switching stress on the gate oxide of the pull-down nMOS device PD. The output from the first level shifter L/S is coupled to the gate of a pull-up pMOS PU. The output from the second level shifter L/Sa is coupled to the gate of a pull-down nMOS PD of the wordline driver. The wordline driver D consists of a pull-up pMOS PU, a pull-down MOS PD, and a second nMOS pull-down devices K which is called a killer device. This killer device is used to deselect the half-selected wordlines so they will not be floating. Details are further explained in a following section.

Figure 3A:
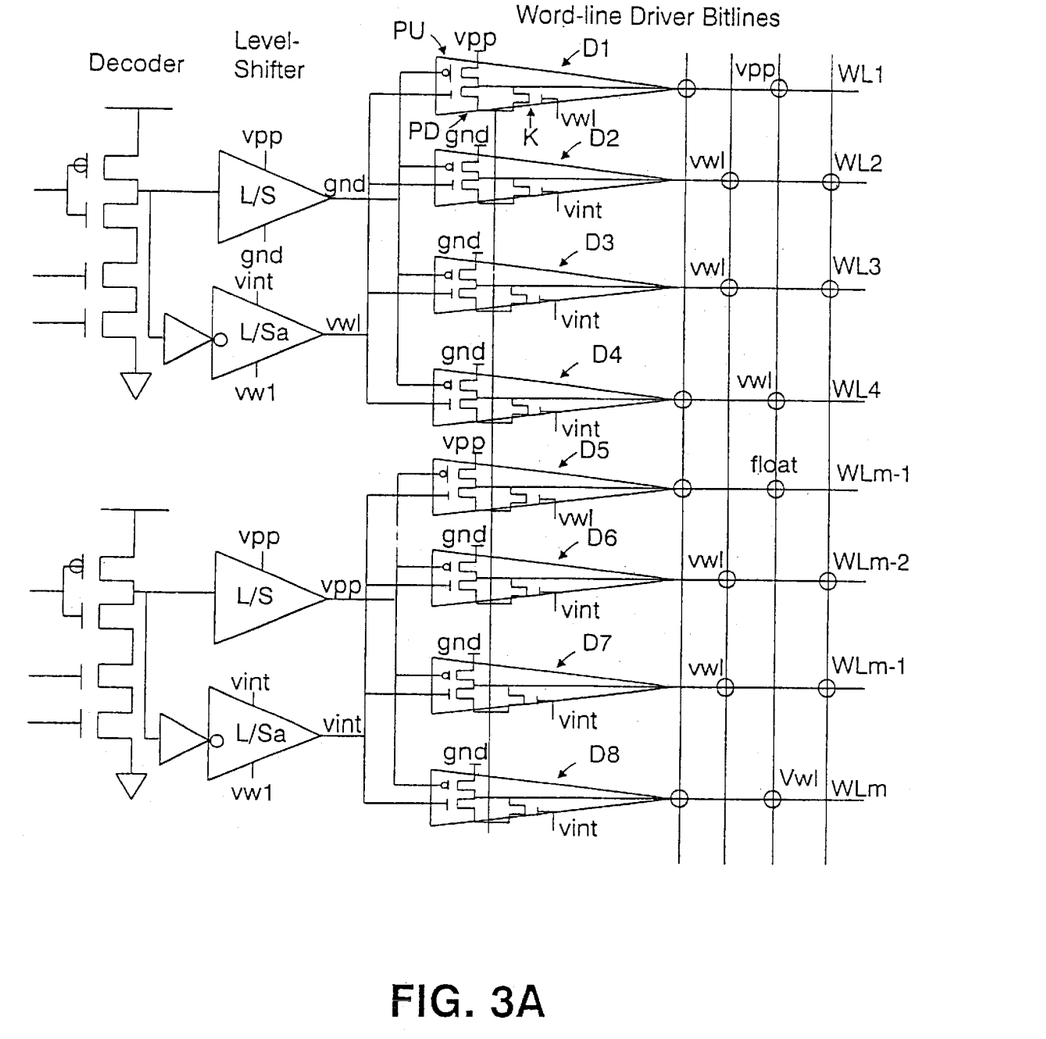
FIG. 3A illustrates the coupling effect of a conventional prior art wordline driver.

The wordline drivers are decoded in a group of four, D1, D2, D3, D4 and D5, D6, D7, D8 as shown in FIG. 3A. That is, each decoded output from a level shifter is tied to a group of four wordline drivers. One of the four wordline drivers is selected by decoding the sources of the pull-up pMOS devices as well as the gates of the killer devices.

For example, as shown in FIG. 3A, if the first wordline WL1 is selected, the first group of four wordline drivers D1, D2, D3, D4 is first selected through the first level shifter by switching its output which couples the gates of the pMOS pull-up devices from Vpp to ground, and through the second level shifter by switching its output which couples the gates of the pull-down nMOS devices from Vint to Vwl. At this moment, the first group of the four wordline drivers are ready for the second level decoding to select one of the four wordlines. A two-bit predecoder (not shown in FIG. 3A) is used to activate one of the four wordline drivers. In order to activate WL1, the source of the pMOS pull-up device is tied to Vpp, while the gate of the killer device is tied to Vwl, as shown in FIG. 3A. At this moment, the sources of the other three pMOS pull-up devices stay at ground, and the gates of the other three killer devices stay at vint, as shown in FIG. 3A. This second level decoding is applied to all the wordline drivers in the first level decoded group of four. As shown in the bottom of FIG. 3A, for drivers D5–D8, the gates of all the drivers are deselected, that is, Vpp is tied to the pMOS pull-up devices and Vint is tied to the nMOS pull-down devices.

The killer devices K play an important role to hold the half-selected wordlines at Vwl to avoid a wordline floating problem. For example, as illustrated in FIG. 3A, the half-selected wordlines are those wordlines WL2–WL4 which are not selected by the second level decoding but are selected by the first level decoding. For example, the drivers of WL2, WL3 and WL4 are half-selected. Since the gates of the pull-down nMOS devices are turned off by being connected to Vwl, without killer devices, these wordlines would float.

For a prolonged wordline operation, such as a page mode operation, the coupling effect could cause a data loss on these wordlines. Therefore, it is desirable that during array operation no wordlines float. On the other hand, for a small array architecture, each time all of the cells along a wordline are accessed, no page mode operation is needed. As a result, floating wordlines may be acceptable because they only float for a short period of time. A description of a new wordline driver circuit follows which significantly reduces the driver size without compromising the wordline access performance.

SUMMARY OF THE INVENTION

Accordingly, it is a primary object of the present invention to provide a short cycle DRAM using a floating wordline, dynamic row decoder and bitline VDD precharge which improves the array efficiency of a short cycle DRAM (3–6 ns) without compromising its performance. More specifically, the subject invention provides a small size wordline driver circuit to reduce row size of a short cycle DRAM without compromising row access timing.

A further object of the present invention is to implement a dynamic decoding operation which intentionally allows some of the deselected wordlines to float during row access.

One more object of the subject invention is to implement a Vdd bitline precharge/sensing technique to avoid a detrimental (or positive) coupling effect to the floating wordlines during row accessing.

Another object of the present invention is to implement a Vdd data-line (or DQ) precharge for a read operation and control of incoming data timing to avoid a detrimental (or positive) coupling effect for a write operation.

BRIEF DESCRIPTION OF THE DRAWINGS

The foregoing objects and advantages of the present invention for a short cycle DRAM using a floating wordline, a dynamic row decoder and bitline VDD precharge may be more readily understood by one skilled in the art with reference being had to the following detailed description of several preferred embodiments thereof, taken in conjunction with the accompanying drawings wherein like elements are designated by identical reference numerals throughout the several views, and in which:

FIG. 2A-1 illustrates a typical prior art wordline driver of a conventional DRAM which comprises a level shifter L/S and a driver D.

FIG. 2A-2 illustrates a typical prior art wordline driver wherein two level shifters L/S, L/Sa are used to reduce voltage stress.

FIG. 2B illustrates two new and compact wordline driver circuits pursuant to the present invention.

DETAILED DESCRIPTION OF THE DRAWINGS

The New Driver

Due to the uniqueness of a short cycle DRAM operation, FIG. 2B-1 illustrates a new and compact wordline driver circuit pursuant to the present invention. FIG. 1 is a comparison of wordline driver and wordline length for the present invention and the prior art. FIG. 1A illustrates the present invention wherein a master wordline MW/L drives 4 sets of local wordlines LW/Ls, each of which has 32 bitline pairs, for a total of 128 pairs of bitlines. Since the wordline is significantly shorter than a conventional wordline as shown in FIG. 1B, the driver size can be very small. The wordline length of a typical conventional array is about 16 times longer than that of a short cycle array. Although the master wordline has significantly low sheet resistance, the delay on the local wordline is usually poor. The sheet resistance ratio of a copper master wordline to a doped polysilicon local wordline is about 10K (e.g. 0.04 ohm/sq versus 400 ohm/sq). By using a short wordline, the delay on the local wordline is greatly reduced. This is one reason why the access time can be short.

Figure 2B:
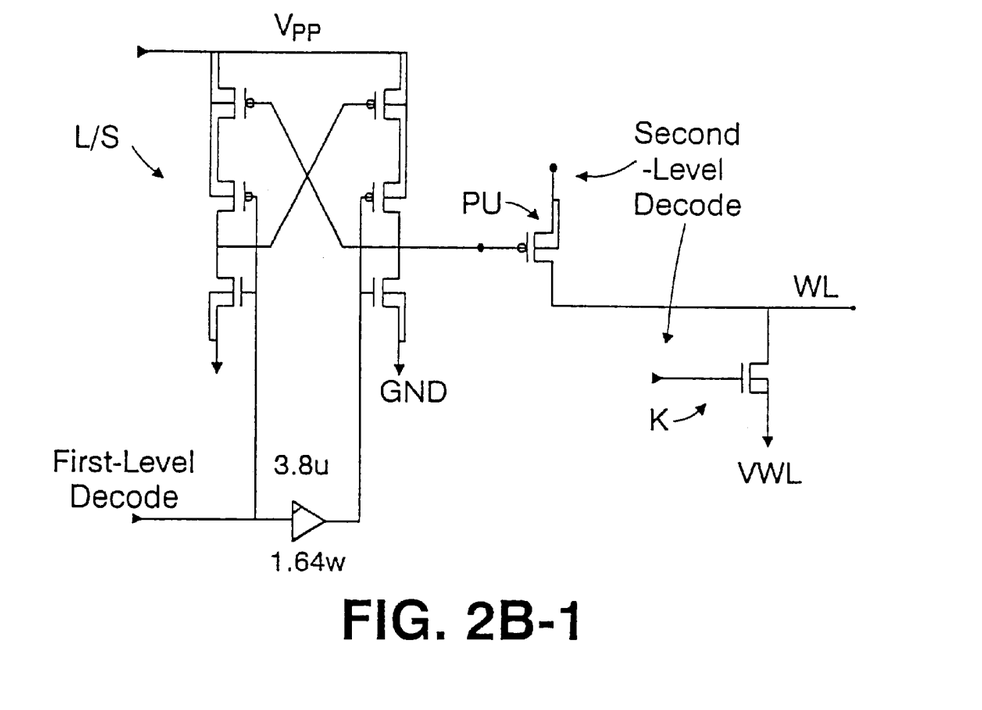
Figure 2B:
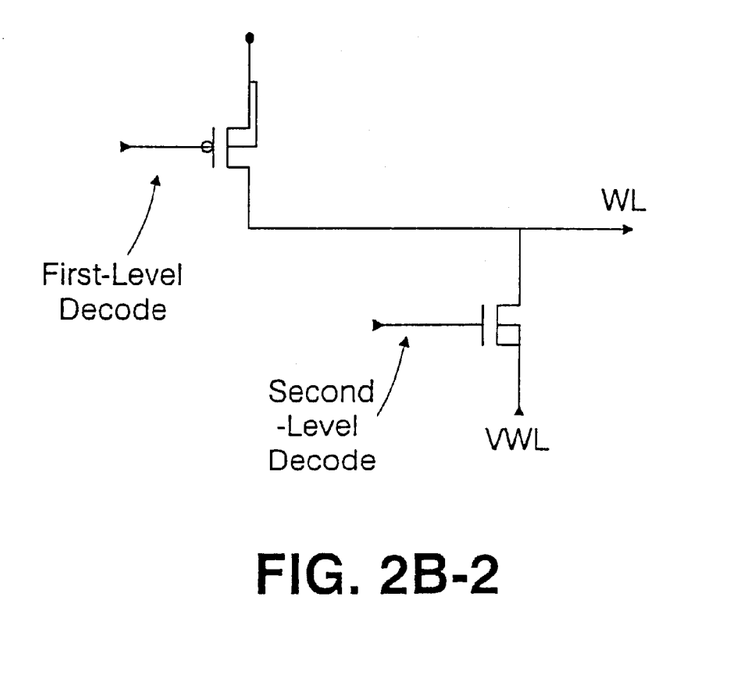

The short cycle DRAM driver circuit of FIG. 2B-1 does not need the pull-down nMOS device PD as in the prior art of FIG. 2A. This is because: (1) no page-mode operation is supported by the short cycle DRAM (operates with only 1 page each time). Since the wordline is short, each access accesses all of the data cells along the wordline. In other words, the wordline is activated only for a period of about 1.6 ns within a 3.3 ns cycle time. In the other 1.6 ns period, the wordline is restored to a negative level. Therefore the pull-down devices become somewhat redundant to the killer devices. (2) By eliminating the pull-down devices, during a wordline activation period, some wordlines are in a floating state. But by controlling the bitline to wordline coupling, and the dataline to wordline coupling, the floating wordlines do not incur any data loss. Details are further described in the following sections. Without using a pull-down device PD and the corresponding level shifter L/Sa, the resulting layout dimension of the new driver is in the range of 20 to 25 um.

Figure 3B:
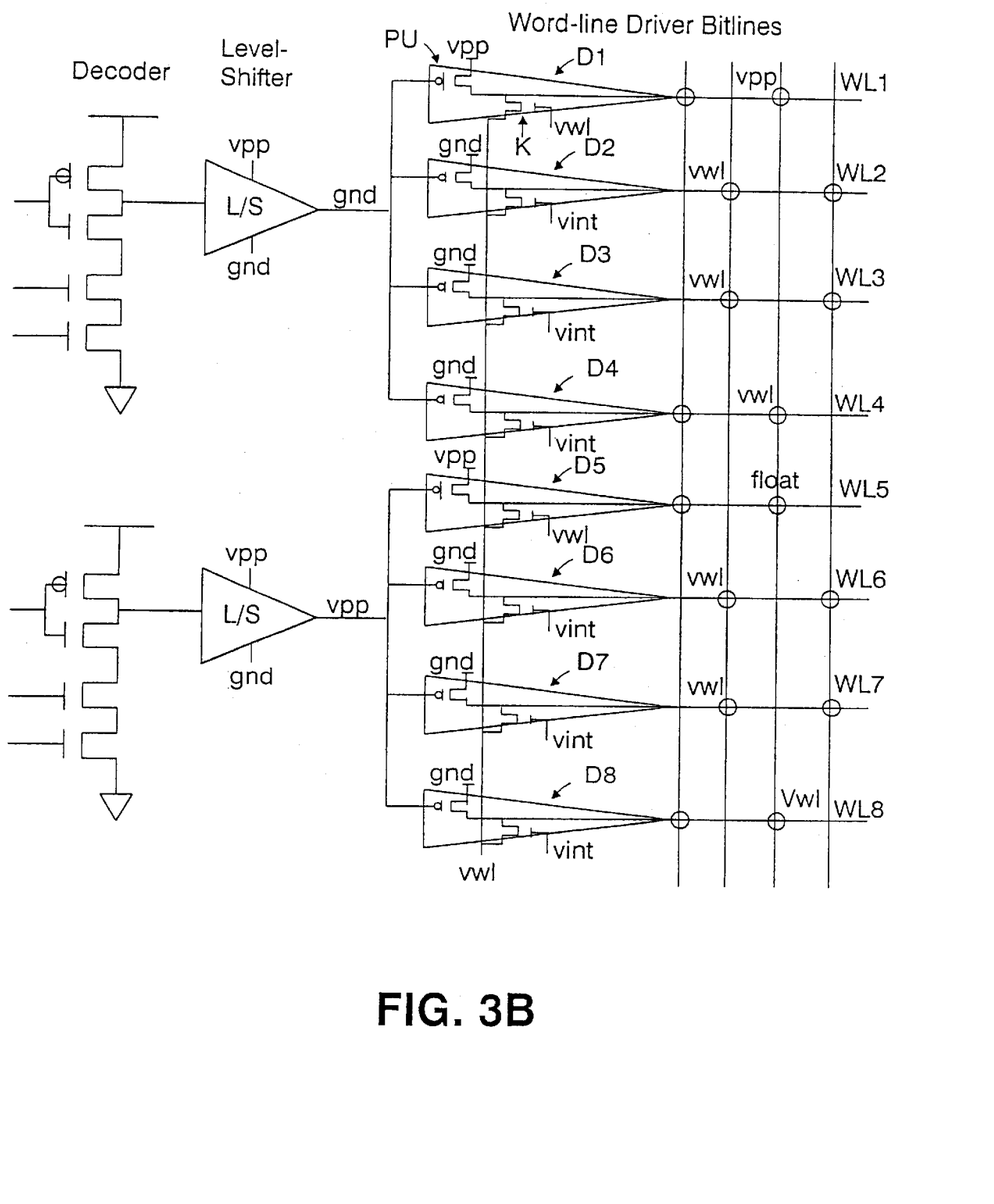
FIG. 3B illustrates the coupling effect of the new wordline driver of the present invention which includes a decoding circuit similar to a conventional decoding circuit, but wherein only one level shifter L/S is needed for each group of four wordline drivers.

FIG. 3B illustrates a full schematic of the new driver which includes a decoding circuit similar to a conventional decoding circuit. Here, only one level shifter L/S is needed for each group of four wordline drivers. Assume that the first group of drivers D1, D2, D3, D4 is selected by the first level decoding, and the first of the four drivers D1 is selected by the second level decoding. At this moment, the killer devices K deselect the other three of the wordlines in the first group by being connected to Vint. If the magnitude of the threshold voltage of the pMOS pull-up device is greater than 0.5V, then there is no current flow from the negative wordline supply to ground via the selected pull-up pMOS devices. However, the first wordline drivers of all the nonselected groups are floating at this moment since their killer devices are turned off. A floating wordline is prohibited in a conventional design since a floating wordline could lead to charge loss when wordlines are unintentionally coupled up by the bitlines or datalines. The short cycle DRAM solves this problem as follows. In FIG. 3B the circles to the right of drivers D1–D8 indicate conventional connection cells.

As shown in FIGS. 2B-2 and 3B, the size of the new driver is reduced by eliminating the level shifter L/Sa and the corresponding pull down device PD, assuming that the decoder is switched from ground to Vpp. This further reduces the length dimension of the driver layout to less than 20 um. However, it could leave some unselected driver gates in a floating state. Since there is no possibility of coupling in this area, from an area savings point of view, this approach is safe.

Method to Avoid Floating Wordline Coupling

Negative coupling (down) of bitlines and datalines to the floating wordlines is not a problem as it does not result in a data loss. Positive coupling (up) of bitlines and datalines to the floating wordlines is avoided by using a Vdd sensing technique, as shown in FIG. 4. In FIG. 4, CLK means clock, READ means a read operation which is active low, WRITE means a write operation which is active low, ADD means address, WL is wordline, BL is bitline, BL is complementary bitline, DO is data out, and DI is data in.

Figure 4A:
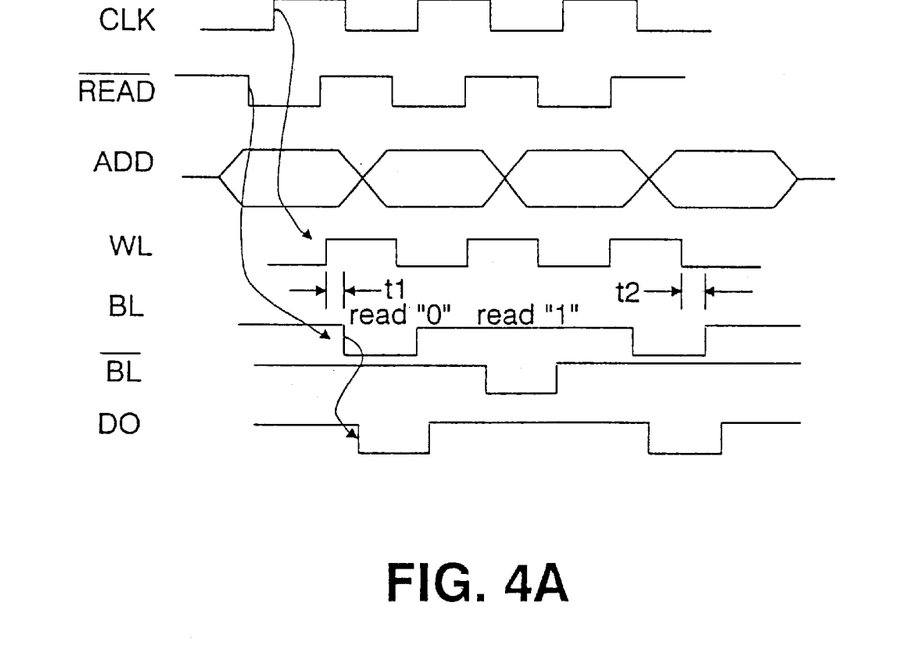
FIG. 4A illustrates the waveforms for a synchronized short cycle DRAM read operation of the present invention, and shows that positive coupling (up) of bitlines and datalines to the floating wordlines is avoided by using a Vdd sensing technique.

FIG. 4A illustrates waveforms of a synchronized short cycle DRAM read operation. When a wordline is activated and triggered by the clock timing, with a certain delay as indicated by the top curved arrow, the bitlines are first precharged to Vdd and are discharged towards ground when sensing a "low" signal with a certain delay, as indicated by the middle curved arrow. With another delay as indicated by the bottom curved arrow, the datalines are also pulled from precharged Vdd (BL is high) towards ground. It is critical to ensure that all wordlines, floating or not, are restored before the bitlines and datalines are precharged. This is done by setting bitlines and datalines precharge signals after a wordline is deactivated by a timing margin "t2". Stated differently, in FIG. 4A, the bitlines BLs and datalines DLs couple the wordlines WLs lower when the WLs are floating which doesn't cause a data loss. The BLs and DLs couple the WLs higher only when the WLs are not floating and therefore coupling is not a problem.

It is clear that coupling-down of the floating wordlines WL by the bitlines BL does not cause any cell charge leakage. Normally, only coupling-up causes a charge leakage. For a short-cycle operation, the wordline floating period is very short (e.g. 1.6 ns). Although, the floating wordlines are coupled down by the bitlines/datalines, they are tied to a negative level during the wordline precharge period. Therefore, the precharges (or up-swing) of the bitlines BLs and the datalines DLs have no detrimental coupling effect to the wordlines WL.

Figure 4B:
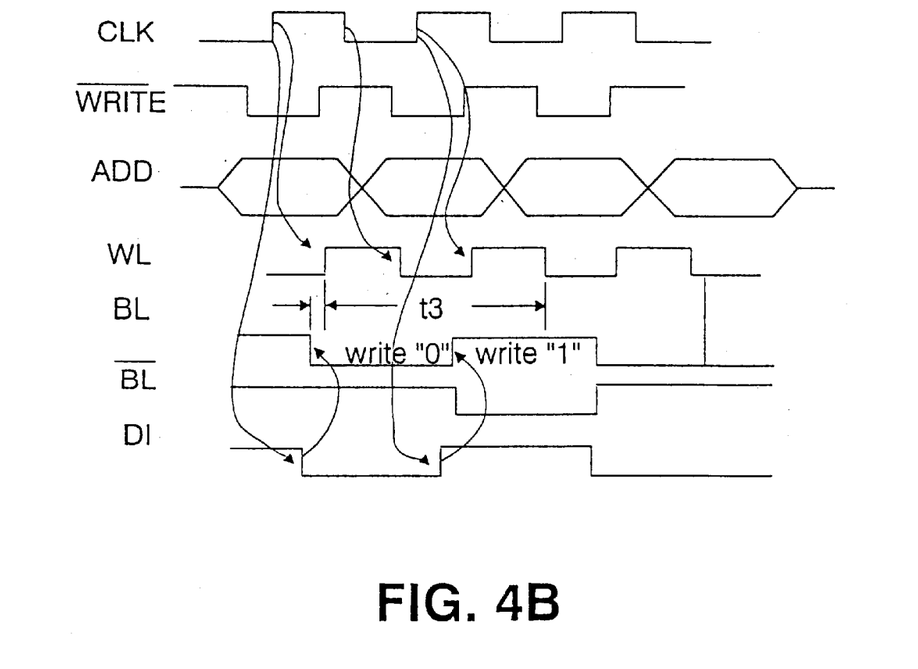
FIG. 4B illustrates the waveforms for a synchronized short cycle DRAM write operation of the present invention, and shows that positive coupling (up) of bitlines and datalines to the floating wordlines is avoided by using a Vdd sensing technique.

For a synchronous short cycle DRAM write operation, as shown in the waveforms of FIG. 4B, similarly the rising edge of the clock triggers the wordlines with a certain delay. The clock also triggers the data input with a certain delay. However, the data precedes the wordline by a set-up time t3. In other words, the datalines DL and bitlines BL are already switched (to high, or low) before the wordline WL is activated. Therefore, such a swing has no adverse upward coupling effect to the wordlines which during the transitions are low and not floating. On the other hand, the falling edge of the clock CLK triggers the wordline WL to an off state with a certain delay. The next rising edge of the clock CLK triggers the dataline again with a certain delay. Therefore, the wordlines WL are deactivated before the switching of datalines DL and bitlines BL before inputting the next data DL. Again, there is no adverse upward coupling effect between datalines D1 and bitlines BL to the wordlines WL during a write operation as the wordlines WL are low and not floating during upward transitions (precharging) of the lines DL and BL.

While several embodiments and variations of the present invention for a short cycle DRAM using a floating wordline, dynamic row decoder and bitline VDD precharge are described in detail herein, it should be apparent that the disclosure and teachings of the present invention will suggest many alternative designs to those skilled in the art.

Having thus described our invention, what we claim as new and desire to secure by Letters Patent is:

1. A semiconductor dynamic random access memory (DRAM) comprising a memory array having a plurality of bitlines, and a plurality of wordlines and corresponding wordline drivers, wherein during a memory read operation when a selected wordline is activated by a wordline driver, some deselected wordlines are allowed to float in a floating state while the bitlines transition from a high state to a low state which does not cause a data loss.

2. The DRAM circuit of claim 1, wherein each wordline driver comprises a single pull-up device and a single pull-down device, each wordline has a low state and a high state in which the voltage on the wordline floats, and Vdd sensing is used during operation, in which the bitlines transition from low states to high states only when the wordlines are in a low state, to prevent capacitive coupling from adversely effecting data operations on the wordlines.

3. The DRAM circuit of claim 1, further comprising a plurality of datalines which also transition from low states to high states only when the wordlines are in a low state, to prevent capacitive coupling from adversely affect data operations on the wordlines.

4. The DRAM circuit of claim 1, further comprising first level row decoders and second level row decoders to decode the wordlines, wherein every r number of n wordlines in the DRAM are grouped together into p=n/r groups, for a first level of decoder decoding one of the p groups of wordlines is selected, for a second level of decoder decoding one of r wordlines of the selected group is activated, and the remaining (r-1) wordlines in the selected group are deactivated.

5. The DRAM circuit of claim 4, wherein, in each (p-1) deselected group, one wordline driver is floating since both an associated pull-up device and an associated killer device are off.

6. The DRAM circuit of claim 1, wherein during bitline sensing, all bitlines fall from Vdd to Vdd-delta when sensing a low signal, wherein delta is in the range of 400 mV to Vdd.

7. The DRAM circuit of claim 1, wherein during bitline sensing, all bitlines are maintained at Vdd when sensing a high signal.

8. The DRAM circuit of claim 1, wherein during precharging of the bitlines, all of the bitlines are precharged to Vdd.

9. The DRAM circuit of claim 1, wherein during data reading, all dataout lines fall from Vdd to Vdd-delta2 when reading a high signal, wherein delta 2 is in the range of 500 mV to Vdd.

10. The DRAM circuit of claim 1, wherein during data reading, all dataout lines fall from a high signal Vdd to Vdd-delta 3 when reading a low signal, wherein delta 3 is in the range of 0V to 200MV.

11. The DRAM circuit of claim 1, wherein during data reading, coupling between the bitlines and the floating wordlines does not affect data retention in memory cells associated with the floating wordlines since the coupling is only in a negative direction, and not in a positive direction.

12. The DRAM circuit of claim 1, wherein during data writing, coupling between the bitlines and the floating wordlines does not affect data retention in memory cells associated with the floating wordline since the bitlines are switched prior to and after a wordline floating period.

13. The DRAM circuit of claim 1, wherein during data reading, coupling between data-outlines and the floating wordlines does not affect data retention in memory cells associated with the floating wordlines since the data-out lines are switched up after a wordline activation period.

14. The DRAM circuit of claim 1, wherein during data writing, coupling between data-in lines and the floating wordlines does not affect data retention in memory cells associated with the floating wordlines since the data-in lines are switched prior to and after a wordline activation period.

15. A semiconductor dynamic random access memory (DRAM) comprising a memory array having a plurality of wordlines coupled to a plurality of corresponding wordline drivers, wherein each wordline driver comprises a pull-up pMOS device and a pull-down device, and wherein during a memory read operation when a selected wordline is activated by a wordline driver, some deselected wordlines are allowed to float in a floating state while the bitlines transition from a high state to a low state which does not cause a data loss.

16. The DRAM circuit of claim 15, wherein the period of each said floating state occupies a first portion of a cycle time, and the floating state is terminated in a second portion of the cycle time.

17. The DRAM circuit of claim 15, wherein coupling sown of datalines to the floating wordlines is avoided by a data set-up and hold time.

18. The DRAM circuit of claim 15, wherein data lines are switched on prior to activation of a wordline, and data lines are switched up after activation of a wordline.

19. The DRAM circuit of claim 15, wherein the deselected wordlines do not float while the bitlines transition from a low state to a high state to avoid a possible data loss caused by capacitive coupling between the bitlines and the deselected wordlines.

20. The DRAM circuit of claim 1, wherein the deselected wordlines do not float while the bitlines transition from a low state to a high state to avoid a possible data loss caused by capacitive coupling between the bitlines and the deselected wordlines.

* * * * *